US012669562B2

(12) United States Patent　　(10) Patent No.:　US 12,669,562 B2
Fischer et al.　　　　　　　　　(45) Date of Patent:　Jun. 30, 2026

(54) SYSTEMS AND METHODS FOR FAST QUANTITATIVE NMR SPECTRUM ACQUISITION

(71) Applicant: Bruker BioSpin GmbH & Co. KG, Ettlingen (DE)

(72) Inventors: Christian Fischer, Rheinstetten (DE); Karl-Friedrich Ratzsch, Karlsruhe (DE); Fabrice Moriaud, Wallisellen (CH)

(73) Assignee: BRUKER BIOSPIN GMBH & CO. KG, Ettlingen (DE)

( * ) Notice: Subject to any disclaimer, the term of this patent is extended or adjusted under 35 U.S.C. 154(b) by 88 days.

(21) Appl. No.: 18/793,172

(22) Filed: Aug. 2, 2024

(65) Prior Publication Data

US 2025/0044387 A1　　Feb. 6, 2025

(30) Foreign Application Priority Data

Aug. 4, 2023　(EP) ..................................... 23189885

(51) Int. Cl.
*G01R 33/46*　　　(2006.01)
(52) U.S. Cl.
CPC ......... *G01R 33/4616* (2013.01); *G01R 33/46* (2013.01); *G01R 33/4625* (2013.01)
(58) Field of Classification Search
CPC . G01R 33/4616; G01R 33/46; G01R 33/4625
See application file for complete search history.

(56) References Cited

U.S. PATENT DOCUMENTS

| 2005/0225324 A1* | 10/2005 | Lendi | G01R 33/4625 |
| | | | 324/309 |
| 2013/0234706 A1* | 9/2013 | Mandal | G01R 33/46 |
| | | | 324/303 |
| 2022/0343565 A1* | 10/2022 | Takeshima | G01R 33/485 |

OTHER PUBLICATIONS

Bharti, Santosh Kumar, et al. "Improved quantification from 1H-NMR spectra using reduced repetition times." Metabolomics 4.4 (2008): 367-376. (Year: 2008).*
Loening, N. et al.: "Single-scan longitudinal relaxation measurements in high-resolution NMR spectroscopy," Journal of Magnetic Resonance, vol. 164, 2003, pp. 321-328.

* cited by examiner

*Primary Examiner* — Rishi R Patel
(74) *Attorney, Agent, or Firm* — Brake Hughes Bellermann LLP

(57)　　　　　　ABSTRACT

Fast quantitative NMR data acquisition for NMR scans performed on a sample is provided. Scan batches on the sample are performed, where each batch comprises a long delay scan, followed by a set of short delay scans. Each scan is associated with a corresponding scan time point in relation to the long delay scan time point of the respective scan batch. For each corresponding scan time point, aggregated NMR spectrum portions are determined showing a decay over time, which is fitted with an exponential decay function. An averaged integral loss is computed for each scan time point. For each NMR spectrum of the scan batches, an integral associated with a respective region of interest is multiplied with a corresponding correction factor. The integrals associated with the corrected NMR spectra are summed to obtain a representation of the NMR signal intensity in the region of interest for the sample.

20 Claims, 14 Drawing Sheets

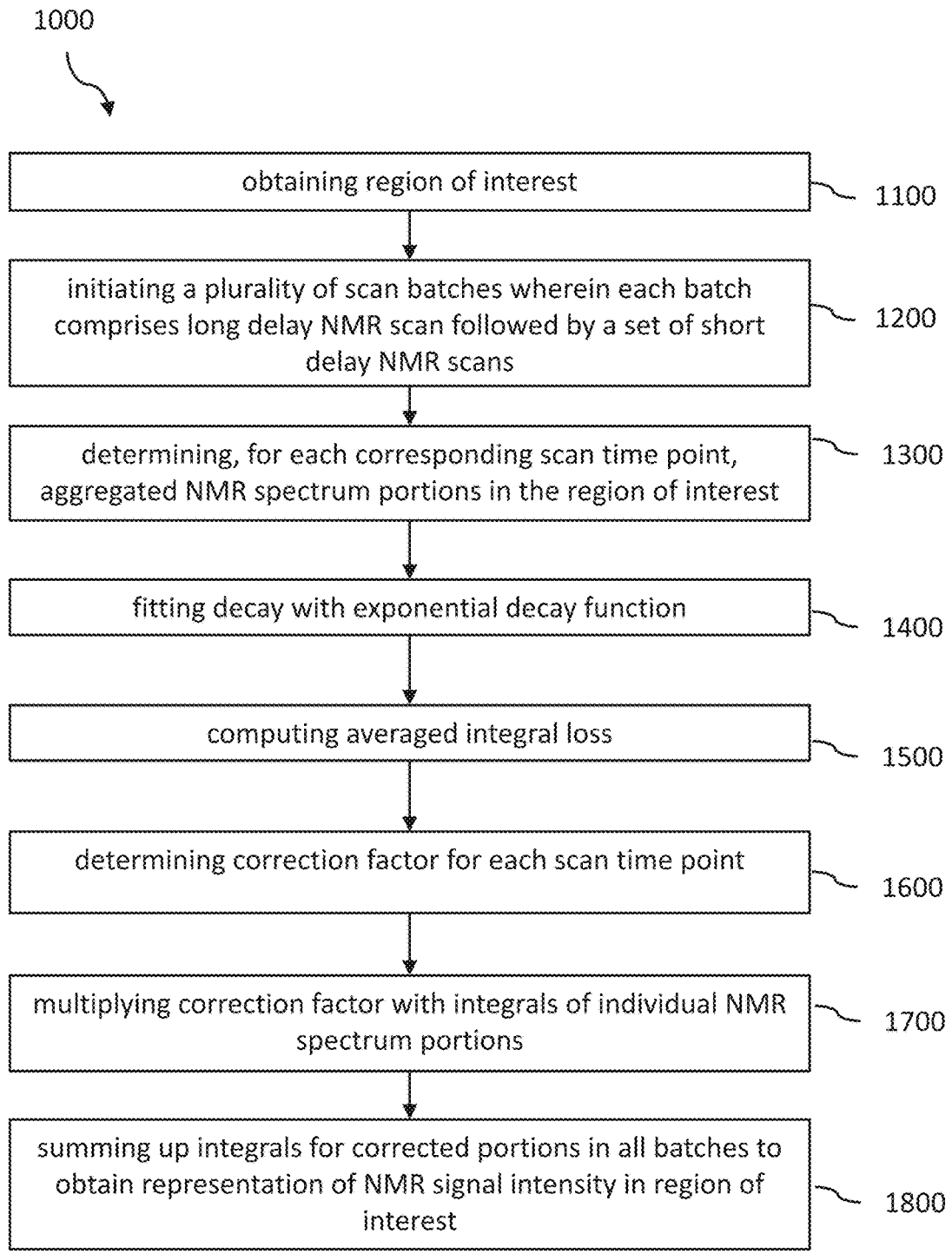

1000 obtaining region of interest — 1100 initiating a plurality of scan batches wherein each batch comprises long delay NMR scan followed by a set of short delay NMR scans — 1200 determining, for each corresponding scan time point, aggregated NMR spectrum portions in the region of interest — 1300 fitting decay with exponential decay function — 1400 computing averaged integral loss — 1500 determining correction factor for each scan time point — 1600 multiplying correction factor with integrals of individual NMR spectrum portions — 1700 summing up integrals for corrected portions in all batches to obtain representation of NMR signal intensity in region of interest — 1800

| Integral | A1 | A2 | A3 | B1 |
|---|---|---|---|---|
| A1 | 1 | 2.001 | 2.014 | 0.832 |
| A2 | | 1 | 1.0057 | 0.416 |
| A3 | | | 1 | 0.413 |
| B1 | | | | 1 |

91-2

| Integral | A1 | A2 | A3 | B1 |
|---|---|---|---|---|
| A1 | 0 | 0.12% | 0.69% | 0.01% |
| A2 | | 0 | 0.57% | 0.12% |
| A3 | | | 0 | 0.96% |
| B1 | | | | 0 |

| Integral | A1 | A2 | A3 | B1 |
|---|---|---|---|---|
| A1 | 1 | 2.028 | 1.920 | 0.936 |
| A2 | | 1 | 0.947 | 0.416 |
| A3 | | | 1 | 0.488 |
| B1 | | | | 1 |

92-2

| Integral | A1 | A2 | A3 | B1 |
|---|---|---|---|---|
| A1 | 0 | 1.37% | 4.02% | 12.74% |
| A2 | | 0 | 5.3% | 11.22% |
| A3 | | | 0 | 17.46% |
| B1 | | | | 0 |

| A1 | A2 | A3 | B1 |
|---|---|---|---|
| 94% | 93% | 99.9% | 83% |

| Integral | A1 | A2 | A3 | B1 |
|---|---|---|---|---|
| A1 | 1 | 1.99 | 1.99 | 0.84 |
| A2 | | 1 | 1 | 0.42 |
| A3 | | | 1 | 0.42 |
| B1 | | | | 1 |

97-2

| Integral | A1 | A2 | A3 | B1 |
|---|---|---|---|---|
| A1 | 0 | 0.42% | 0.46% | 0.55% |
| A2 | | 0 | 0.04% | 0.97% |
| A3 | | | 0 | 1.01% |
| B1 | | | | 0 |

FIG. 9H 98-1

| Integral | A1 | A2 | A3 | B1 |
|---|---|---|---|---|
| A1 | 1 | 1.99 | 1.99 | 0.84 |
| A2 | | 1 | 0.99 | 0.42 |
| A3 | | | 1 | 0.42 |
| B1 | | | | 1 |

98-2

| Integral | A1 | A2 | A3 | B1 |
|---|---|---|---|---|
| A1 | 0 | 0.02% | 0.61% | 0.87% |
| A2 | | 0 | 0.6% | 0.88% |
| A3 | | | 0 | 1.5% |
| B1 | | | | 0 |

FIG. 9I

SYSTEMS AND METHODS FOR FAST QUANTITATIVE NMR SPECTRUM ACQUISITION

CROSS-REFERENCE TO RELATED APPLICATION

This application claims priority to EP Patent Application No. EP23189885.9, filed on Aug. 4, 2023, and entitled "Systems and methods for fast quantitative NMR spectrum acquisition," the disclosure of which is hereby incorporated by reference in its entirety.

TECHNICAL FIELD

The present description generally relates to spectroscopic measurements of samples, and more particularly relates to systems and methods for fast quantitative NMR spectrum acquisition with high accuracy.

BACKGROUND

Nuclear magnetic resonance (NMR) is a technique used to study the properties of molecules by measuring the behavior of atomic nuclei in a strong magnetic field. NMR uses the fact that certain atomic nuclei have a property called spin, which causes them to act like tiny magnets. When placing a sample of molecules in a strong magnetic field, the atomic nuclei align with the magnetic field. In this equilibrium state, the nuclei have slightly different energies, depending on their orientation. A sample is placed in a magnetic field and the NMR signal is produced by excitation of the nuclei sample with radio frequency (RF) pulses into nuclear magnetic resonance, which is detected with sensitive RF receivers. The intramolecular magnetic field around an atom in a molecule changes the resonance frequency, thus giving access to details of the electronic structure of a molecule and its individual functional groups. For example, NMR spectroscopy is used to identify monomolecular organic compounds, proteins and other complex molecules. Besides identification, NMR spectroscopy provides detailed information about the structure, dynamics, reaction state, and chemical environment of molecules. Common types of NMR are proton and carbon-13 NMR spectroscopy, but it is applicable to any kind of sample that contains nuclei possessing spin.

In more detail, in NMR spectroscopy, the chemical shift is the resonant frequency of an atomic nucleus relative to a standard in a magnetic field. The position of chemical shifts and the peak intensity at the said position are indicative of the quantity of a molecule in a sample. Chemical shift $\delta$ is usually expressed in parts per million (ppm) by frequency, because it is calculated from:

$$\delta = \frac{v_{sample} - v_{ref}}{v_{ref}}.$$

where vsample is the absolute resonance frequency of the sample and vref is the absolute resonance frequency of a standard reference compound, measured in the same applied magnetic field B0. Since the numerator is usually expressed in hertz, and the denominator in megahertz, $\delta$ is expressed in ppm.

Upon excitation of the sample with a radio frequency (typically 60-1000 MHz) pulse, which moves the nuclei to a higher energy state, a nuclear magnetic resonance response is obtained which is referred to as free induction decay (FID) herein. The FID is a very weak signal and requires sensitive RF receivers to pick up. A Fourier transform can be applied to extract the frequency-domain spectrum from the raw time-domain FID. A spectrum from a single FID typically has a low signal-to-noise ratio. This spectrum contains signals ("peaks") specific to chemical environment around each atomic nucleus and can be used to identify the type of components/molecules in a sample. The intensity of each peak is directly proportional to the respective number of nuclei, and therefore to the mass/concentration of the chemical compound it belongs to in the sample. For accurate quantification especially of dilute (low concentrated) samples, dozens or hundreds of these FID are acquired and accumulated.

Decay times of the excitation, typically measured in seconds, depend on the effectiveness of relaxation, which is faster for lighter nuclei and in solids, and slower for heavier nuclei and in solutions whereas they can be very long in gases. Relaxation time constants are individual for every signal in the spectrum.

Quantitative NMR acquisition is slow (time consuming) because, for reaching a high signal/noise ratio to ensure accurate results, a significant number of FIDs needs to be acquired in individual scans. The individual scans are then summed up into a final FID. In prior art solutions, a delay between such individual scan measurements is required to relax the sample. Advantageously, the sample is fully relaxed. Otherwise, the signal amplitude drops towards an equilibrium value from scan to scan. The delay time (also known as the relaxation delay or recycle delay) is the time period between these successive acquisitions (individual scans). It allows the spins to return to their thermodynamic equilibrium. If it is set too short, the "relaxation" is incomplete and the signal intensity in successive acquisitions is diminished. For quantitative NMR, a delay of typically 5× or 7× a time constant T1 of this relaxation is recommended, leading to 99.3 resp. 99.9% relaxation. A relaxation above 99% is referred to as near-full relaxation herein. However, the value of T1 is not known a priori, and it is generally different for each signal in the spectrum. In the paper "Practical guide for selection of 1H qNMR acquisition and processing parameters confirmed by automated spectra evaluation. Magn Reson Chem. 2017 November; 55 (11): 996-1005. doi: 10.1002/mrc.4622. Epub 2017 Jun. 20. PMID: 28561374.", the authors Monakhova Y B, Diehl B W K focus on the influence of acquisition and post-acquisition parameters on the developed automated routine in particular, and on the quantitative NMR (qNMR) results in general, which has not been undertaken previously in a systematic and automated manner. They provide a guide on how to select the acquisition parameters. 7*T1 of the longest delay, is the recommendation for ensuring full relaxation of the sample.

An incorrect choice of the delay leads to a quantification bias. To be on the safe side, typically, a longer delay (e.g., 60 s to 90 s) than actually required is often used after each individual scan. Standard experiments to determine the T1 time constants exist, but require significant additional time.

SUMMARY

It is therefore a challenge to provide methods and systems for fast quantitative NMR spectrum acquisitions in particular with regard to samples with low concentrations of components of interest. For example, when using standard prior art acquisition methods, the total acquisition time when using 60 s delays to guarantee full relaxation of a low concentration sample easily exceeds 30 minutes which is inappropriate for many practical applications. The fast and accurate NMR spectrum acquisition approach disclosed herein in accordance with the independent claims can reduce the total acquisition time to less than a third required by the prior art methods while still maintaining a high level of accuracy of quantification.

In other words, the above technical problem is solved by embodiments of a computer-implemented method, a computer program product, and a computer system in accordance with the independent claims.

In one embodiment, a computer-implemented method is provided for fast quantitative NMR data acquisition for a plurality of NMR scans performed on a sample. The method can be performed by a computer system which executes a respective computer program implementing functional modules of the computer system adapted to perform the various steps of the computer-implemented method at runtime.

Initially, the method obtains a region of interest as integration region of NMR spectra. The region of interest is a common term in NMR spectroscopy describing a portion of an NMR spectrum (i.e., a range of wavenumbers) with relevant signal information which is characteristic of a particular molecule (i.e., the nuclei of said molecule) contained in the physical sample which is analyzed. The integral of the signal intensity in the region of interest typically is a measure for the concentration of said molecule. Thereby, a single point in an NMR spectrum already corresponds to a frequency range because of the nature of NMR spectroscopy. That is, already the intensity value at a single point in the NMR spectrum can be considered to represent the intensity integral of the underlying frequency range. Typically, the region of interest is received from a user who is interested in a particular component. Alternatively, the region of interest may be obtained from a respective database which stores region of interest information for various components. For example, the method can be used to sequentially analyze multiple regions of interest of measured NMR spectra.

The herein disclosed approach uses a long delay interval and one or more short delay intervals to allow for relaxation of said nuclei (i.e., the relaxation of the respective spins) between individual NRM scans. In general, a delay interval as used herein defines a time interval subsequent to an acquisition time interval of a respective NMR scan to allow for further relaxation of said nuclei after the respective acquisition time interval. Typically, after the excitation pulse, an NMR scan is performed during the acquisition time interval to measure the decay of the signal intensity caused by the relaxation of the nuclei. However, at the end of the acquisition time interval, the nuclei are not yet fully relaxed. Therefore, a delay time interval can be added after the acquisition time interval which allows such further relaxation of the nuclei. Without such additional delay time, typically the measurement results with regard to low concentrated components of the sample deteriorate with each subsequent NMR scan such that the signal-to-noise ratio becomes very poor. On the other hand, in particular in industrial measurement scenarios, it is desired to perform the sequence of NMR scans required for low concentrated components as fast as possible. The herein disclosed approach makes use of the surprising effect that highly accurate measurements can still be performed when using a sequence of NMR scans with very short delay intervals (referred to as short delay scans) as long as an NMR scan with a long delay interval (referred to as long delay scan) is performed again after a couple short delay scans. Thereby, the duration of the long delay interval is chosen to allow near-full relaxation of the respective nuclei. Near-full relaxation of the sample, as used herein, describes a state of the sample where at least 99% of the flipped spins have returned into their original direction. The duration of the short delay intervals is shorter than the duration of the long delay interval.

For example, in one implementation, the long delay interval for near-full relaxation of the sample may be selected from the range of 30 s to 120 s to allow a relaxation of the sample above 99%. In another implementation, the long delay interval may be determined via an experiment and may end up shorter than the above-mentioned range. The short delay intervals are typically selected from the range of 0 s to 2 s. Thereby, very good results with the herein disclosed approach were even achieved with a short delay interval of 0 s (negligible delay). That is, a sequence of NMR scans can be performed even without adding any short delay interval at all to the acquisition time interval of the preceding NMR scan if a long delay scan is performed after an appropriate number of short delay scans. It has turned out that the sample relaxation after a long delay interval is sufficient to obtain again good intensity values for the subsequent short delay scans.

For this purpose, the method performs a plurality of scan batches on the sample. Each batch comprises a long delay scan (performed after at least a long delay interval ensuring near-full relaxation of said nuclei) followed by a set of short delay scans (each short delay scan performed after a short delay interval smaller than the long delay interval), such that the total number of NMR scans in the plurality of batches is greater or equal to a minimal required number of NMR scans for the sample. It is to be noted that the first scan of the first batch by definition is a long delay scan because, at the beginning of the measurement, the sample is typically fully relaxed. Each scan is associated with a corresponding scan time point in relation to the long delay scan time point of the respective scan batch. In other words, each batch always starts with a long delay scan which defines a corresponding long delay scan time point LDT. The first short delay scan in each batch is considered to take place at the corresponding scan time point SDT1, the second short delay scan point at corresponding scan time point SDT2, and so on. All short delay scans are associated with a corresponding scan time point which implies that the number of short delay scans in each batch is the same.

In one implementation, the short delay interval is the same for all short delay scans. In an alternative implementation, different short delay intervals may be used for the short delay scans of a batch. That is, in this implementation, at least two short delay scans of a scan batch use different short delay intervals. It is to be noted that in case different short delay intervals are used for the first batch, all subsequent batches need to apply the different delay intervals in the same order as the first batch to derive meaningful results. Advantageously, the set of short delay scans in a scan batch comprises 3 to 9 short delay scans. The number of batches depends on the sample and the required total number of NMR scans for a respective low concentrated component.

The method continues with determining, for each corresponding scan time point, aggregated NMR spectrum portions in the region of interest-via integration of the signal over said region of interest. That is, the intensity values in the region of interest of all batches are added up for LDT, SDT1, SDT2 and so on. Thereby, the aggregated NMR spectrum portion at LDT (after near-full relaxation) is highest and the aggregated values at the subsequent corresponding short delay scan time points show a decay over time. It is to be noted that for obtaining the aggregated NMR spectrum portions it is irrelevant whether the method firstly applies a Fourier Transformation to all individual NMR scans and then aggregates the obtained individual NMR spectra, or firstly aggregates the individual NMR scans into aggregated NMR scans (by corresponding scan time point) and then applies a Fourier Transformation to the aggregated NMR scans to obtain the aggregated NMR spectrum portions. The result is the same because the operation is commutative.

An exponential decay function is then fit into the decay curve of the aggregated NMR spectrum portions over the corresponding scan time points. Applying the fitted function to each scan time point calculates the averaged integral loss for each scan time point. From the determined averaged integral loss a correction factor is determined for each scan time point such that the integral loss is compensated.

The correction factors are then applied to all NMR spectra obtained from the plurality of scan batches by multiplying for each NMR spectrum an integral associated with the respective region of interest with the corresponding correction factor. This correction ensures that also the smaller contributions of short delay scans are corrected to a value which is in the order of the long delay scan of the respective batch. Thereby, the correction may be applied to only a single point in the spectra in such cases where the region of interest corresponds to a single point in the spectra. Finally, the method sums up the integrals associated with the corrected NMR spectra in all batches to obtain a representation of the NMR signal intensity in the region of interest for said sample.

In one embodiment, the correction factor may be calculated for and applied to all points within the region of interest of each individual NMR spectrum of the respective batch. The correction factor may even be calculated for and applied to all points of each individual NMR spectrum of the respective batch, and all corrected individual NMR spectra can then be summed up into a single aggregated NMR spectrum.

The herein disclosed approach allows to perform a fast NMR measurement of low concentration components in the sample because most of the necessary scans are performed as short delay scans. Hence, the time of the measurement is determined primarily by the few long delay scans in the plurality of batches. The results are almost as accurate as using a series of long delay scans only, and more accurate than measurements where the long delay value is shortened to a value where the sample relaxation falls below a critical threshold (e.g., 99%). Details regarding comparative measurements for the different approaches are shown in the detailed description.

In one embodiment, the method may provide an estimated NMR signal intensity in the region of interest for said sample after each scan batch by summing up the integrals of all corrected individual NMR spectra in already processed scan batches. In other words, the method continuously performs the above-described analysis at the end of each batch and provides the respective intermediate results to the user.

In one embodiment, excitation pulses may be applied to the sample for obtaining the individual NMR spectra have a flip angle smaller than or equal to 90° and greater than 0°. Advantageously, the flip angle is in the range from 30° to 45°.

In one embodiment, after the delay interval of a current individual NMR scan and before a subsequent excitation pulse is applied to the sample, a trim pulse may be applied to the sample for removing residual transverse magnetization. That is, the NMR spectrometer is instructed (e.g., by a computer system executing the computer-implemented method) to apply such trim pulse.

In one embodiment, a computer program product is provided which has computer-readable instructions that, when loaded into the memory of a computing device and processed by one or more processors of the computing device, cause the computing device to execute steps for fast quantitative NMR data acquisition for a plurality of NMR scans performed on a sample according to the herein disclosed computer-implemented method.

In one embodiment, a computer system is provided for fast quantitative NMR data acquisition for a plurality of NMR scans performed on a sample. The system has a memory storing computer-readable instructions implementing a plurality of functional modules, and has one or more processors for executing the computer-readable instructions to instantiate said functional modules for performing steps according to the herein disclosed computer-implemented method.

Further aspects of the description will be realized and attained by means of the elements and combinations particularly depicted in the appended claims. It is to be understood that both, the foregoing general description and the following detailed description are exemplary and explanatory only and are not restrictive of the description as claimed.

BRIEF DESCRIPTION OF THE DRAWINGS

FIG. 2 is a flowchart of a computer-implemented method for fast quantitative NMR data acquisition according to an embodiment;

FIGS. 9A to 9I illustrate a comparison of results for ROI integrals between different setups for scan batches applied to the same sample.

DETAILED DESCRIPTION

Figure 1:
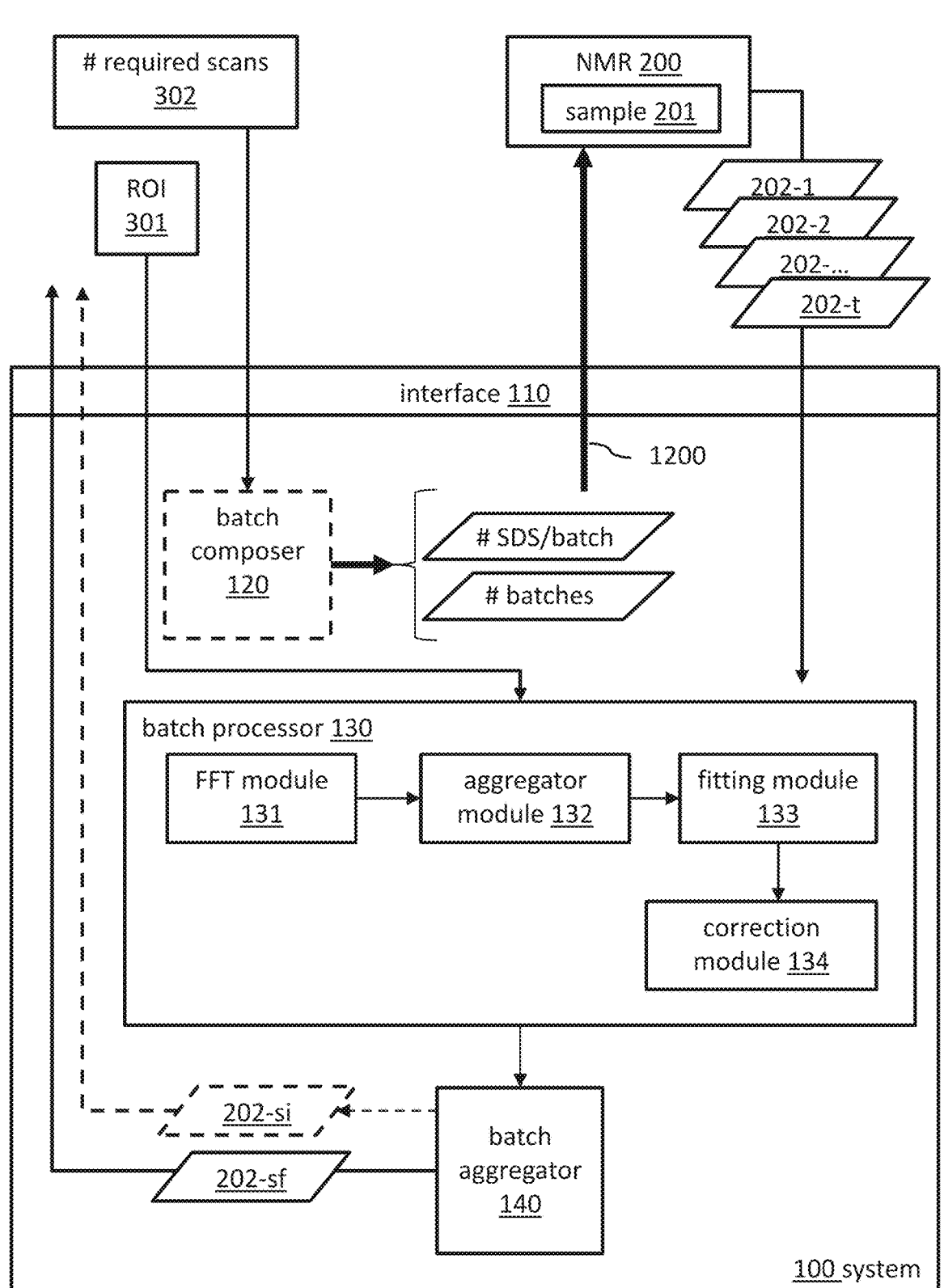
FIG. 1 is a block diagram illustrating a computer system for fast quantitative NMR data acquisition according to an embodiment.

FIG. 1 shows a block diagram of a computer system 100 for fast quantitative NMR data acquisition for a plurality of NMR scans performed on a sample 201 using an NMR spectrometer 200. System 100 implements a plurality of functional modules which are configured to perform the various data processing tasks for the fast quantitative NMR data acquisition. The functional modules, which will be described in detail herein, are advantageously implemented in software but may also be implemented by programmable hardware components or ASICS. In the case of using a software implementation, computer-readable instructions of the software are read into a memory of the system and processed by one or more processors of the system. When the computer-readable instructions are executed at runtime, runtime instances of the respective modules are instantiated and perform the computer-implemented method 1000 of the embodiment as shown in the flowchart of FIG. 2. System 100 is described in more detail in the context of method 1000 and reference numbers of both figures are used in the following description where appropriate.

For NMR measurements, typically an operator of the NMR spectrometer 200 specifies one or more regions of interest (ROI) 301 which define the regions within an NMR spectrum providing spectral information with regard to molecules of interest in said sample. System 100 has an interface 110 which supports interface functions adapted to receive information from the operator (e.g., a human machine interface), and also supports interface functions to enable machine-to-machine data exchange. Dependent on the NMR response properties of said molecules, a respective number of NMR scans may be required to obtain accurate NMR measurement results. In particular, for low concentration molecules, a larger number of subsequent NMR scans may be needed to arrive at a measurement result which allows to derive a reliable estimate for the concentration of said molecules in said sample 201. Alternatively, the number of required scans may also be obtained from a datastore (e.g., a database) which stores respective information for various molecules via respectively adapted interface 110.

A batch composer 120 may obtain 1100 the number of required NMR scans 302 for the NMR measurement of sample 201 and create a batch schedule for the measurement of the sample which distributes the number of required scans on a plurality of scan batches with each batch starting with a long delay scan followed by a series of short delay scans. The batch composer 120 can be an optional component of system 100, or can be an external support tool for the operator (e.g., running on a device, like a smartphone or tablet computer, of the operator). Alternatively, the operator of the NMR spectrometer 200 may manually provide the information about the number of required scans and how they are to be distributed on various scan batches with long delay intervals and short delay intervals to system 100 for instructing the spectrometer 200 accordingly.

Figure 3:
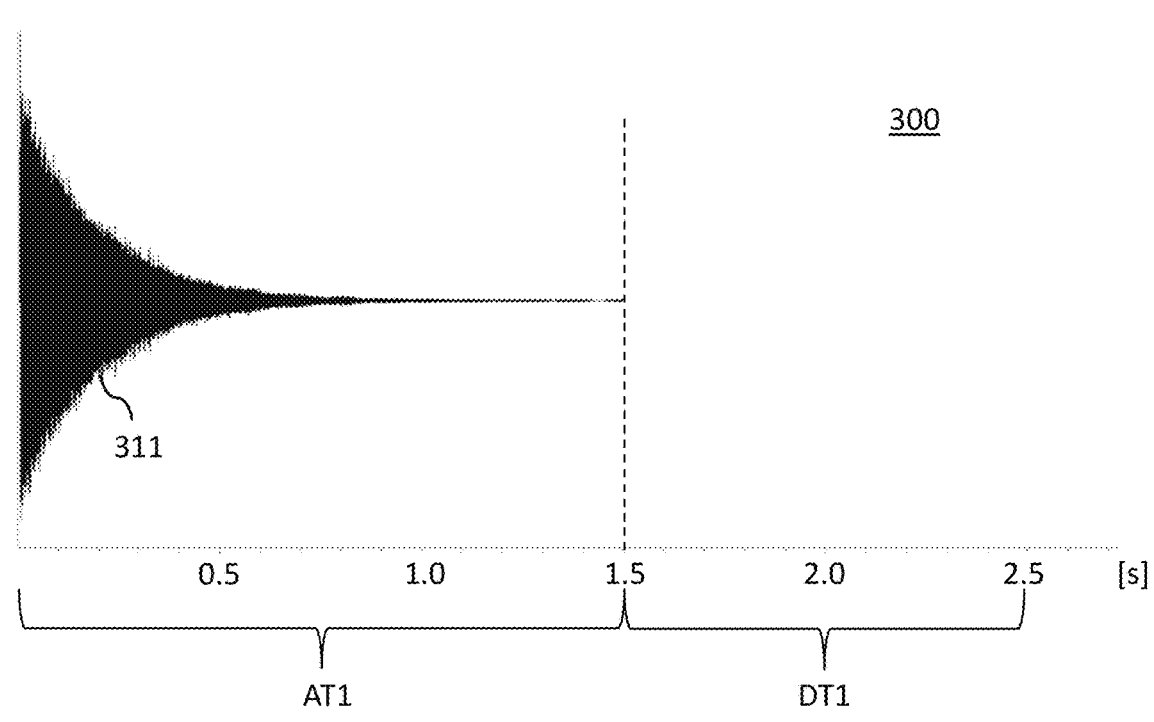
FIG. 3 illustrates an example of an acquisition time interval followed by a delay time interval.

Turning briefly to FIG. 3, graph 300 illustrates FID 311 of a particular NMR scan. A delay time interval in general defines a time interval subsequent to an acquisition time interval of a respective NMR scan to allow for further relaxation of the sample after the preceding acquisition time interval. In the example of FIG. 3, the acquisition time interval AT1 (the decay time of FID 311) has a duration of 1.5 s which is followed by the delay time interval DT1 with a duration of 1 s. The first scan of the first batch in the sequence of NMR scans is always considered to be a long delay scan because the sample has not been subject to an excitation pulse for a long time and full relaxation of the nuclei spins is assumed. In subsequent scan batches, a long delay interval is chosen to allow near-full relaxation of the sample before the long delay scan starting the next scan batch is executed. Typically, for low concentrated molecules, the long delay interval is in the range of 30 s to 120 s to allow a relaxation of the respective nuclei above 99%. Alternatively, the long delay interval may be determined via an experiment which may allow even shorter long delay intervals. The short delay intervals are smaller than the long delay interval and are typically in the range of 0 s to 2 s. That is, in case that the short delay interval is 0 s, the series of short delay scans in a scan batch triggers each short delay scan acquisition time interval right after the end of the preceding acquisition time interval. Advantageously, a scan batch includes 3 to 9 short delay scans after a long delay scan. The short delay intervals may have a duration which is the same for all short delay scans of each scan batch. In another implementation, a scan batch may use different short delay values for different short delay scans. More details regarding these alternative implementations are described in the context of FIG. 6B.

Figure 6A:
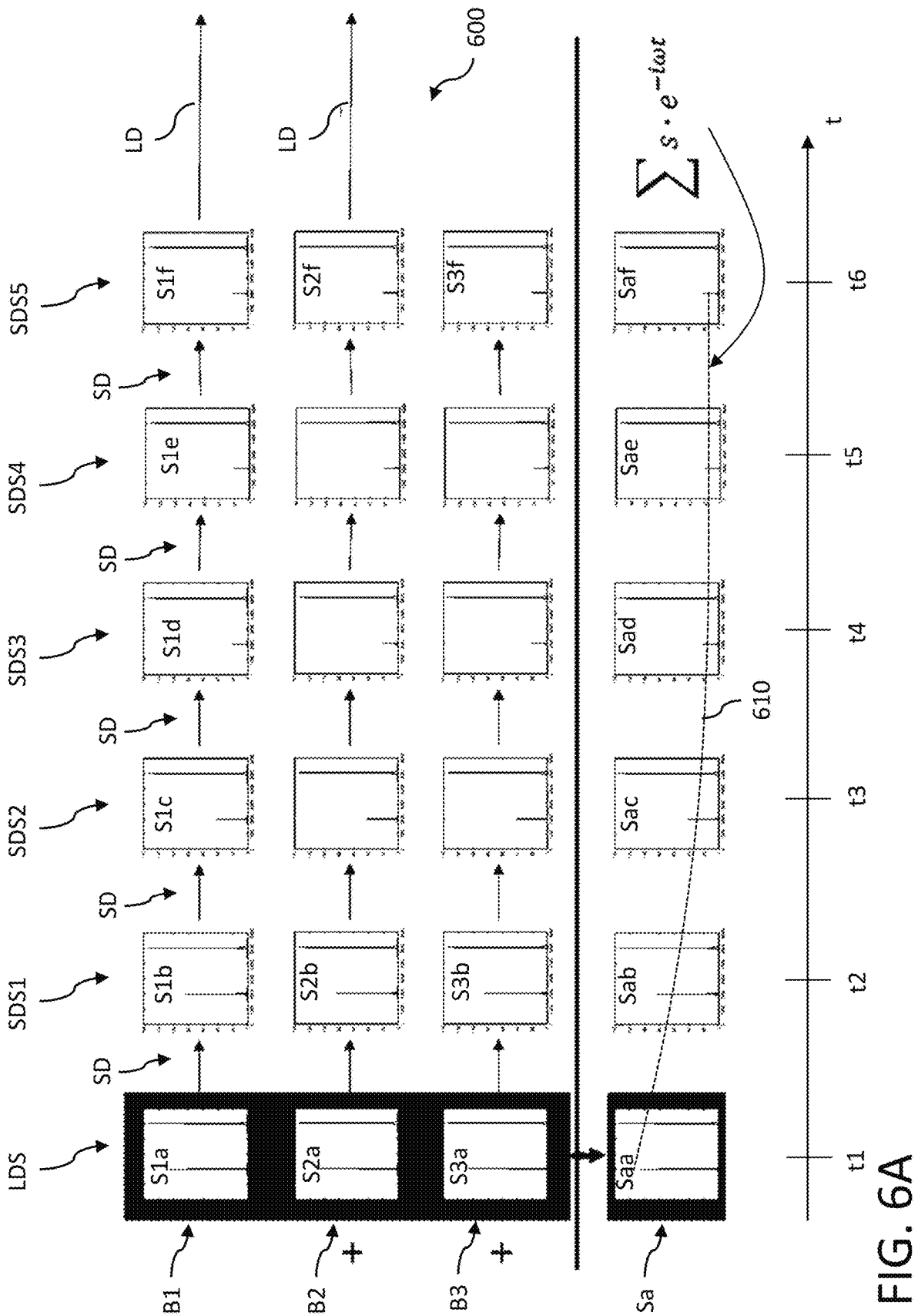
FIG. 6A shows a sequence of NMR scans performed on a sample using a plurality of NMR scan batches separated by long delay intervals according to an embodiment.

The computer system initiates 1200 a series of NMR scans by instructing the NMR spectrometer 200 is then to perform the NMR scans 202-1 to **202-*t* in accordance with the provided schedule of scan batches. Turning briefly to FIG. 6A, a plurality of scan batches B1 to B3 (the schedule 600 of scan batches) is performed on the sample 201**. Each batch comprises a long delay scan LDS performed after a long delay interval LD (or as the initial scan of the first batch B1) ensuring near-full relaxation of said nuclei, followed by a set of short delay scans SDS* Each short delay scan SDS* is performed after a short delay interval SD which is shorter than the long delay interval LD. The total number of NMR scans 202-1 to **202-*t* in the plurality of batches B1 to B3 is greater or equal to a minimal required number of NMR scans for the sample. Thereby, each scan is associated with a corresponding scan time point t1 to t6 in relation to the long delay scan time point of the respective scan batch. In the example, t1 is the corresponding scan time point for the respective long delay scans LDS and t2 to t5 are the corresponding scan time points for the short delay scans SDS1 to SDS5 of each scan batch. In the example of FIG. 6A**, all short time delays SD have the same length. As all acquisition time intervals have the same length, too, the corresponding scan time points t1 to t6 are equidistant.

The NMR scans 202-1 to **202-*t* of all batches are received by a batch processor module 130 of system 100 via interface 110. Interfaces for the exchange of data between NMR spectrometers and computer systems for the analysis of said scans are well known in the art. The batch processor 130 also receives the ROI information 301 (either from the operator of from a respective database). The batch processor 130 then determines 1300 for each corresponding scan time point t1 to t6 aggregated NMR spectrum portions Saa to Saf (cf. FIG. 6A) in the region of interest 301—via integration over said region of interest. The aggregated NMR spectrum portions at the corresponding scan time points show a decay over time. For aggregating NMR spectrum portions, two equivalent implementations may be used. In a first implementation, a Fast Fourier Transformation Module 131** transforms each received NMR scan into a corresponding NMR spectrum S1*a* to S3*f*. Then, an aggregator module 132 of the batch processor 130 is adding up the NMR spectra of corresponding scan time points for each batch. That is, for aggregated spectrum Saa, the spectra S1*a*, S2*a*, S3*a* of the long delay scans of all batches B1 to B3 are aggregated. For aggregated spectrum Sab, the spectra S1*b*, S2*b*, S3*b* of the first delay scan SDS1 of all batches B1 to B3 are aggregated, and so on. It leads to the same aggregation result when, firstly, the aggregator 132 aggregates the original NMR scans (FIDs) of corresponding time points, and secondly, the FFT module 131 transforms the aggregated NMR scans into the corresponding aggregated NMR spectra.

A fitting module 133 of the batch processor 130 fits 1400 the decay in the aggregated NMR spectra over the corresponding time points with an exponential decay function. The exponential decay function is shown as dotted line 610 in FIG. 6A which is fit into the decay curve of the left peak (region of interest) of the aggregated spectra Saa to Saf. In this example, the signal intensity in the region of interest corresponding to the left peak in the NMR spectra shows a strong decay over the corresponding time points whereas the signal intensity in the region of interest around right peak in the spectra is hardly affected by the short delay scans. An interpretation is that the molecule which corresponds to the left region of interest is likely a low concentrated molecule where signal intensity deteriorates quickly with a lack of relaxation of the respective nuclei.

Figure 4A:
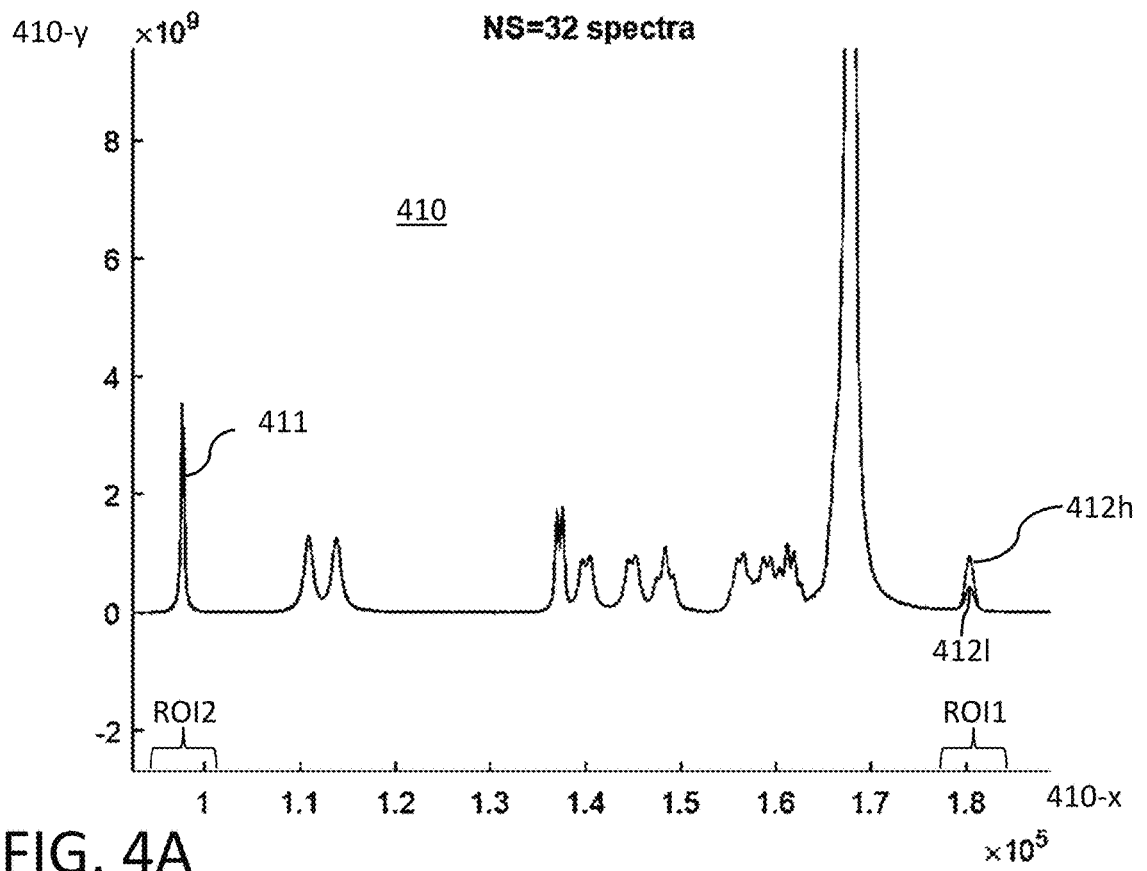
FIGS. 4A, 4B and 4C show an example NMR spectrum obtained from a sample with two regions of interest.
Figures 4B, 4C:
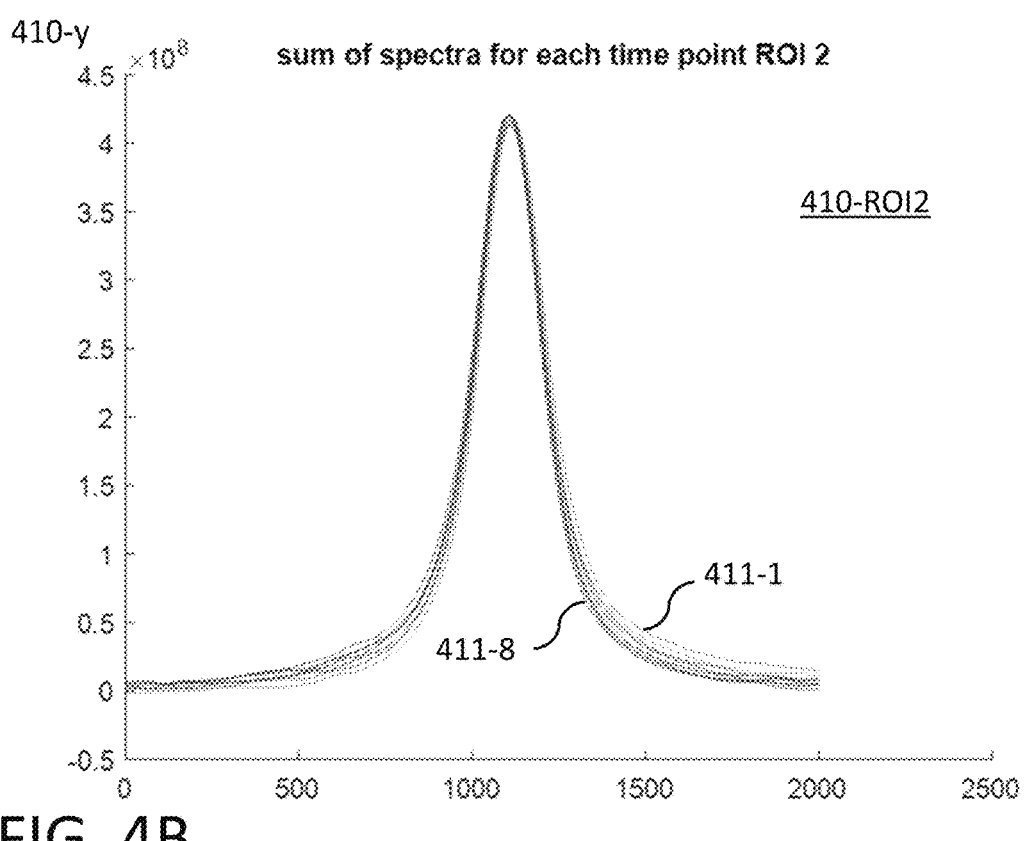

FIGS. 4A to 4B illustrate this phenomenon in more detail. FIG. 4A shows NMR spectra 410 of a given sample for which two regions of interest ROI1 and ROI2 are defined. The total number of NMR scans in this example was 32, thus resulting in 32 spectra. The following batch schedule was applied: Each batch includes a long delay scan and 7 short delay scans with a short delay time interval of 2 s. The long delay interval was 60 s. Four batches were run. Peak 411 in ROI2 is hardly affected by the short delay scans whereas the small peak to the right of the spectrum shows a strong dependency. The signal intensity 410-y of peak 412h is obtained by a long delay scan, whereas the last short delay scan of each batch only leads to a heavily reduced signal intensity as shown by peak 412I. FIGS. 4A and 4B show magnified views of the aggregated spectra for the two regions of interest 410-ROI2 and 410-ROI1. For ROI2 (FIG. 4B), hardly any deviation can be seen between the aggregated spectra 411-1 to 411-8 at the eight corresponding time points of each batch. That is, there is a near full relaxation of the ROI2 nuclei in the sample already at the end of each acquisition time interval. For ROI1 (FIG. 4C), there is a significant deviation in the NMR signal intensity between the aggregate spectrum 412-1 (obtained with long delay scans) and the aggregate spectrum 412-8 (obtained with the last short delay scan of each batch). The decay of the intensity of the remaining spectra between 412-1 and 412-8 illustrates the decay of the aggregated spectra over the corresponding time points which is a typical behavior for low concentrated molecules in the sample.

Figure 5:
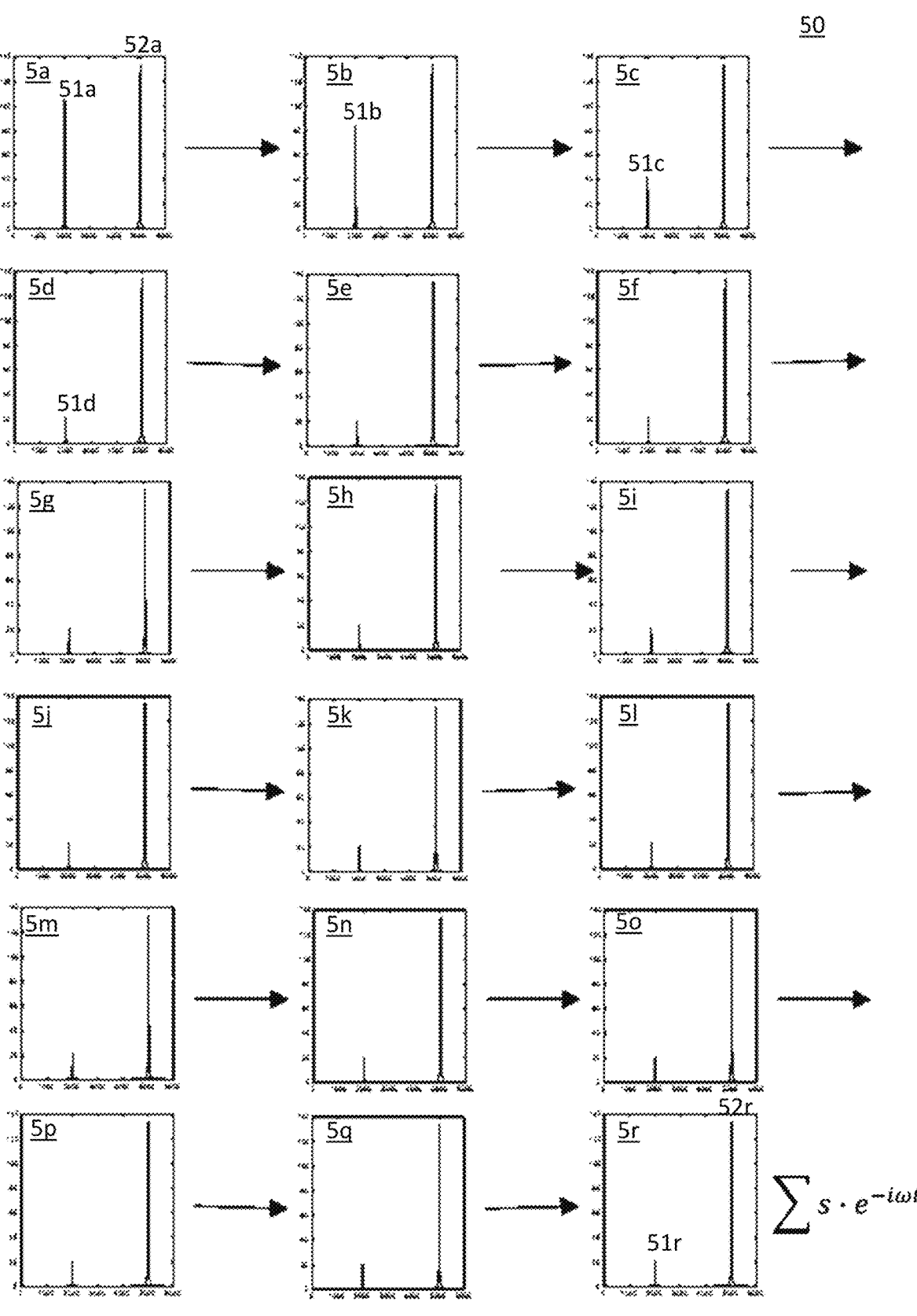
FIG. 5 shows a sequence of NMR scans performed on a sample using a single NMR scan batch.

FIG. 5 illustrates NMR spectra 5a to 5r obtained from plurality 50 of eighteen NMR scans with two regions of interest 51a, 51b. In this experiment, all scans were performed in a single batch where only the first scan 5a corresponds to a long delay scan. All subsequent scans were performed as short delay scans. In the experiment, ROI 51a (low concentrated molecule) shows an exponential decay. The T1 relaxation is an exponential decay, where T1 is the decay constant.

$$DF(t) = s \cdot e^{-i\frac{t}{T_1}}$$

One may fit the exponential decay using the following general function.

$$DF(F) = s \cdot e^{-t \cdot a} + c$$

with the exponential decay of ROI 51a to obtain a result for the signal intensity of the nuclei associated with ROI 51a. However, already after the fourth scan 5d the signal has become so low that an accurate determination of the signal intensity becomes challenging because a fit of the exponential decay function to the measured data becomes increasingly difficult due to the bad signal-to-noise ratio of all scans after scan 5d with regard to ROI 51a. This problem is overcome by using a series of scan batches as described in the context of FIG. 6A where a long delay scan is inserted after the last short delay scan of each batch for recovering the signal quality in the ROI corresponding to the low concentrated molecule for the following short delay scans.

Figure 6B:
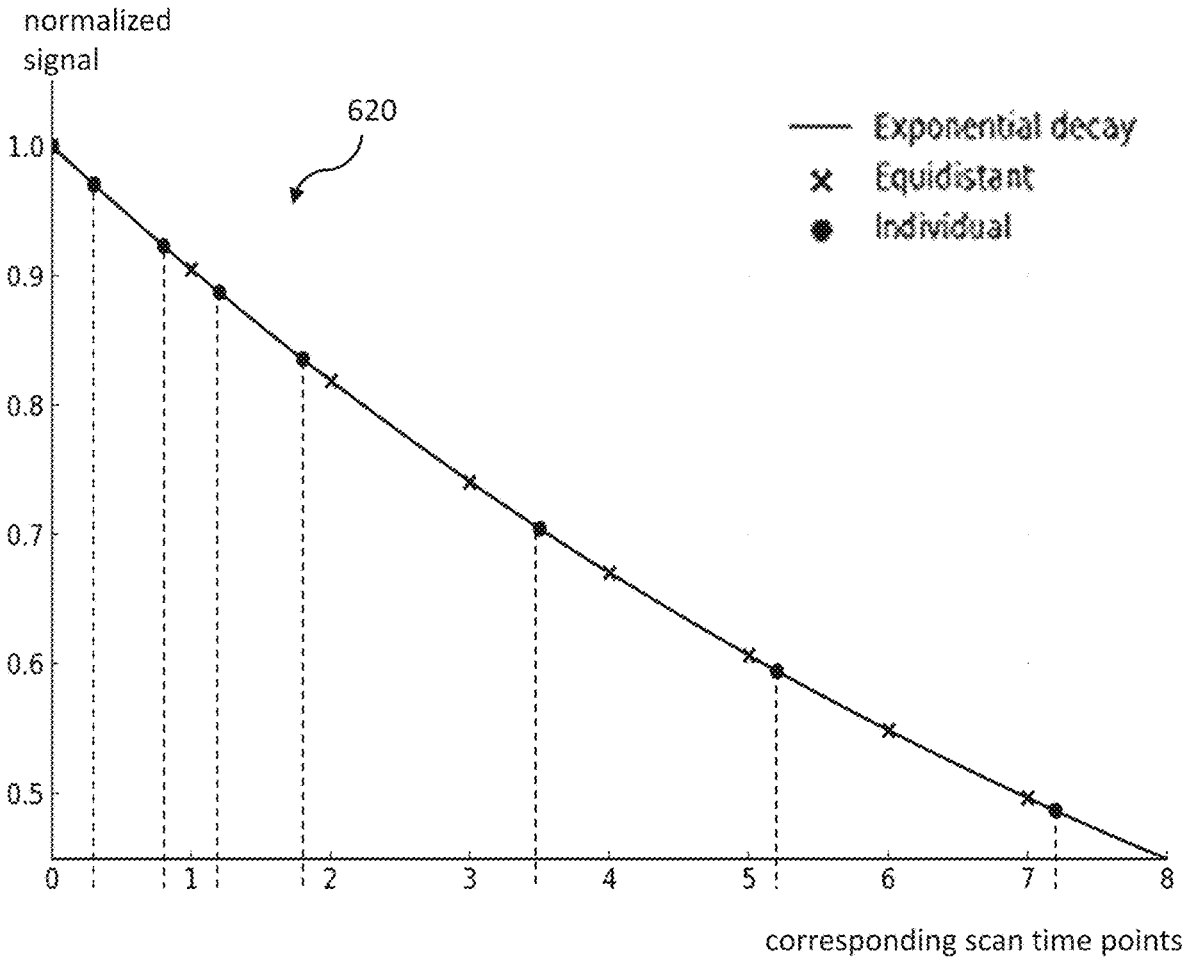
FIG. 6B shows a simulated exponential decay for subsequent NMR scans performed on a sample using short delay intervals of the same length versus short delay intervals of different lengths.

As mentioned earlier, the short delay intervals of all short delay scans may all have the same value leading to equidistant corresponding time points (as it is the case in the example of FIG. 6A). However, it is also possible to vary the short delay intervals within a batch. The same variation is then used in all scan batches. FIG. 6B illustrates a simulated normalized exponential decay function 620 for equidistant scan time points 0 to 8 (illustrated by x-symbols). This scenario corresponds to the implementation using a single value for all short delay intervals in all scan batches (as in FIG. 6A). The black dots (Individual) on the exponentiation decay function illustrate a scenario where different short delay intervals are used for the short delay scans within a batch. The dashed vertical lines show the different time intervals between the scan time points for the short delay scans. Nevertheless, the shift of the corresponding scan time points due to the varying short delay intervals still ensures that the measured intensity values are all on the normalized exponential decay function 620. That is, also in scenarios where short delay intervals vary within the batches, the exponential decay function can still be fit to the respective aggregate spectrum portions at the corresponding scan time points. If varying delays dt(n) are used between each scan within the scan batch, a modified exponential function can be used which is iteratively calculated more precisely, taking into account the expected integral intensities from the relaxation time constant T1, the individual delays dt(n) and the applied pulse angle.

Turning back to FIG. 1, a correction module 134 of the batch processor 130 is used to compute 1500 an averaged integral loss for each scan time point by applying the fitted function to each scan time point, and to determine 1600 from the averaged integral loss a correction factor for each scan time point such that the integral loss is compensated. For example, the following formula could be applied:

$$CorrectionFactor(t) = Integral(timepoint\ 0)/fit(t)$$

Figure 7:
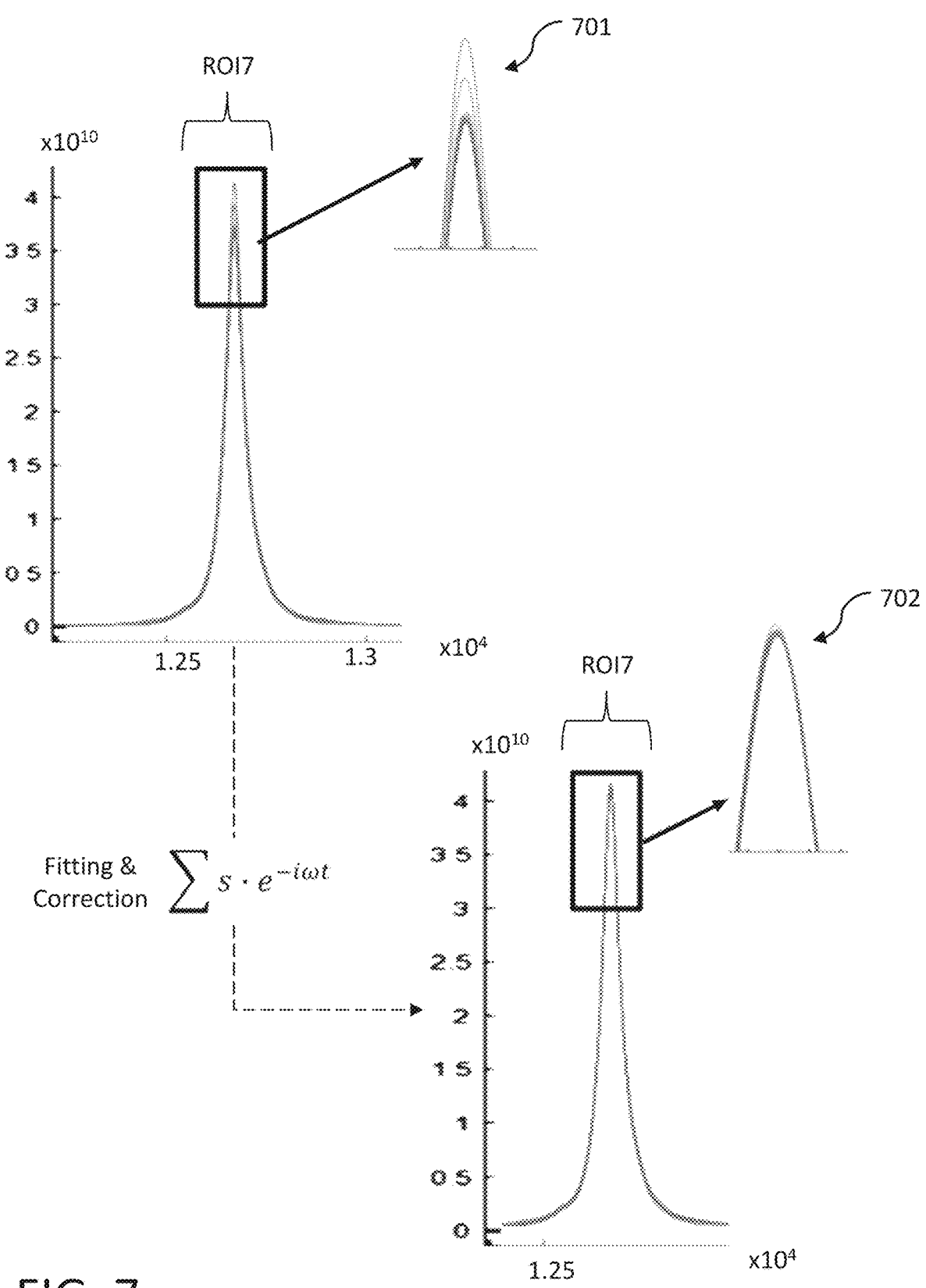
FIG. 7 illustrates differences of individual NMR scans performed on a sample and correction for incomplete relaxation according to an embodiment.

Then, for each NMR spectrum of the plurality of scan batches, an integral associated with the respective region of interest is multiplied 1700 with the corresponding correction factor. FIG. 7 illustrates the idea of this correction mechanism with regard to a region of interest ROI7. The magnified view 701 of the obtained NMR spectra illustrates the decay of the signal intensities over the respective scan time points. The Fitting and Correction steps 1400, 1500, 1600 and 1700 are applied. As a result, the corrected spectra in the magnified portion 702 all show approximately the same signal intensities.

Figure 8A:
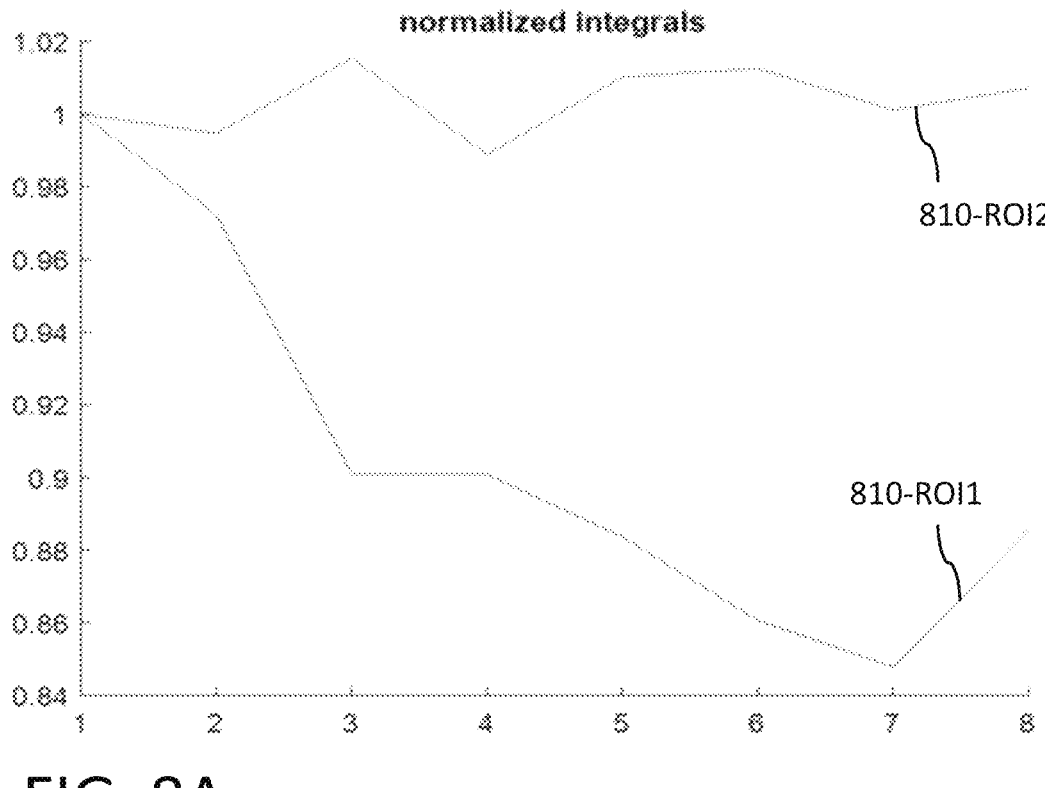
FIGS. 8A, 8B show an example of corrected normalized integrals obtained according to an embodiment.
Figure 8B:
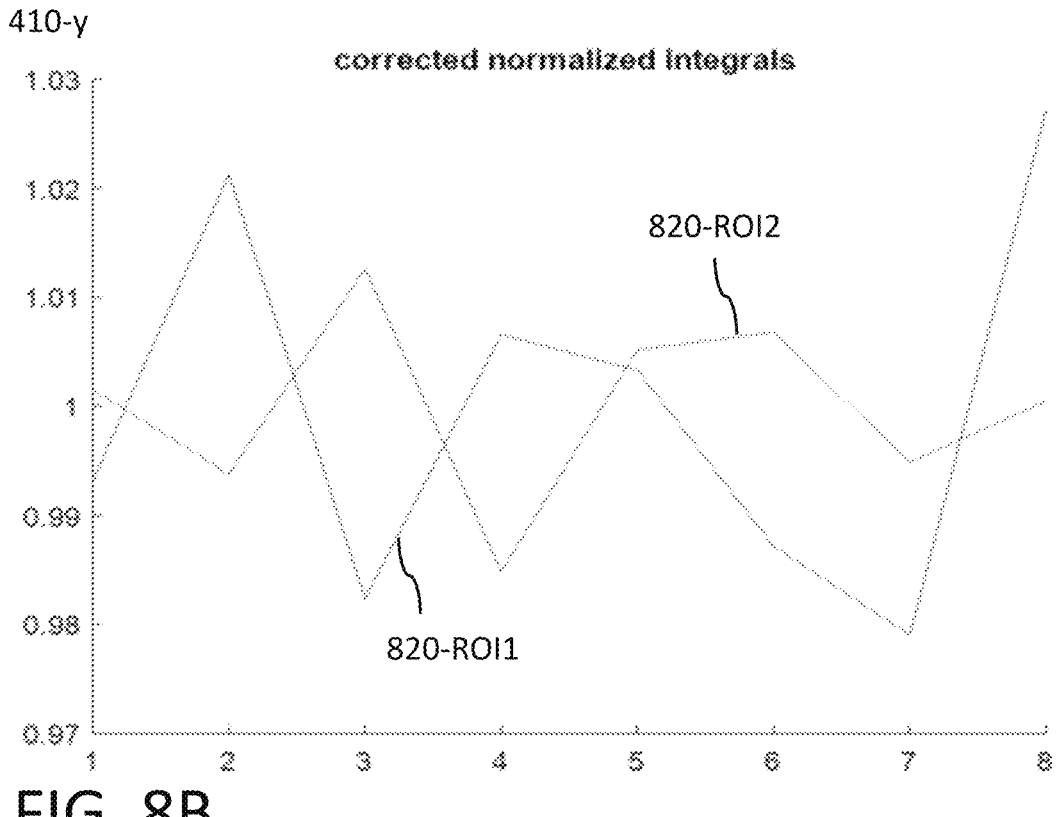

FIGS. 8A and 8B illustrate in more detail and example of the correction of spectra obtained in the example of FIGS. 4A and 4B. FIG. 8A shows the normalized integrals 810-ROI1 and 810-ROI2 of the aggregated spectra for the two regions of interest ROI1 and ROI2 over the corresponding scan time points 1 to 8. It can be seen that the peak in ROI2 remains unaffected by the short delay scans as the integrals are substantially the same for all the corresponding scan time points. However, the peak in ROI1 shows an exponential decay over the corresponding scan time points. The effect that the normalized integral of 810-ROI1 at corresponding scan time point 8 is larger than at corresponding scan time point 7 results from the fact that the signal to noise ratio for the respective low concentrated molecule is already very low when the 7th short delay scan has been performed in the respective scan batches. Nevertheless, after the fitting and correction steps, the corrected normalized integrals 820-ROI1 show a good coherence with the ideal value of '1'. After the correction, the spread of all corrected integral values for ROI1 is between 0.97 and 1.03 which is almost as good as the spread for ROI2 (the region of interest unaffected by the short delay scans) with corrected integrals between 0.98 and 1.02. In principle, the above describe correction mechanism derives the correction factor for each corresponding scan time point as the ratio of the respective decay function value to the corresponding intensity value at the first corresponding scan time point (i.e., the aggregated spectra associated with the long delay scans of all batches).

Finally, a batch integrator 140 of system 100 sums up 1800 the integrals associated with the corrected NMR spectra in all batches B1 to B3. It is to be noted that, after the fitting and correction steps, each corrected spectrum of each short delay scan of each batch has similar intensity values as the corrected spectrum obtained from the respective long delay scan. As a consequence, after the last scan batch is completed, the batch aggregator 140 obtains a very accurate representation 202-*sf* of the NMR signal intensity in the region of interest for said sample 201 even for low concentrated molecules in a relatively short acquisition time compared to the usual measurement times using only long delay scans for low concentrated molecules.

In one embodiment, the batch integrator 140 may provide an estimated NMR signal intensity 202-*si* in the region of interest for said sample after each scan batch by summing up the integrals of all corrected individual NMR spectra in already processed scan batches. In some scenarios it can be advantageous for an operator to already see the estimate 202-*si* after the first batch and not wait for the final result 202-*sf* after the completion of all batches.

Table 1 shows experimental data for different NMR measurements on the same sample.

In the first row of table 1, data for a standard acquisition NMR measurement is shown. In the standard acquisition setup, only a series of 32 long delay scans with a long delay time interval of 60 s were performed. The total measurement time added up to 33 min 18 s (including acquisition and delay time intervals). The ratio between two integrals associated with two respective ROIs was determined as 1.6421. This ratio determined by a series of NMR scans after near-full relaxation of the nuclei before each scan can be seen as a kind of ground truth of the to-be-determined ratio.

In the second row of table 1, a further "long delay scan only" measurement was performed with 32 long delay scans. However, in order to reduce the total measurement time, the long delay interval was shortened to 30 s resulting in a total measurement time of 17 min and 30 s. The ratio was determined as 1.6548 showing a 0.8% deviation from the ground truth.

In the third row of table 1, a "short delay scan only" measurement was performed by using 32 short delay scans with a short delay interval of 2 s. The total measurement time was substantially reduced to 2 min 25 s. A correction was applied in accordance with the single batch scheme described in the context of FIG. 5 by fitting an exponential decay function with the respective region of interest in each respective NMR spectrum and using the first NMR scan for the normalization of the spectra. However, the ratio was determined as 1.5418 showing a substantial deviation of 6% from the ground truth. A result with such a deviation is not accurate enough to obtain the signal intensity/integral associated with a low concentrated molecule.

In the fourth row, a batchwise NMR measurement in accordance with the scheme according to claim 1 and explained in FIG. 6A was performed with 5 scan batches where each batch started with a long delay scan after a long delay interval of 60 s followed 7 short delay scans with short delay intervals of 2 s. The total number of scans in this measurement was 40, the measurement time was 6 min 30 s which is roughly a third of the less accurate measurement in row 2. The ratio was determined as 1.6493 which only shows a deviation of 0.4% from the ground truth. That is, although the measurement time was reduced to about a third of the measurement time of row 2, the determined ratio was twice as accurate than with the shortened long delay scans of row 2.

Figure 9A:
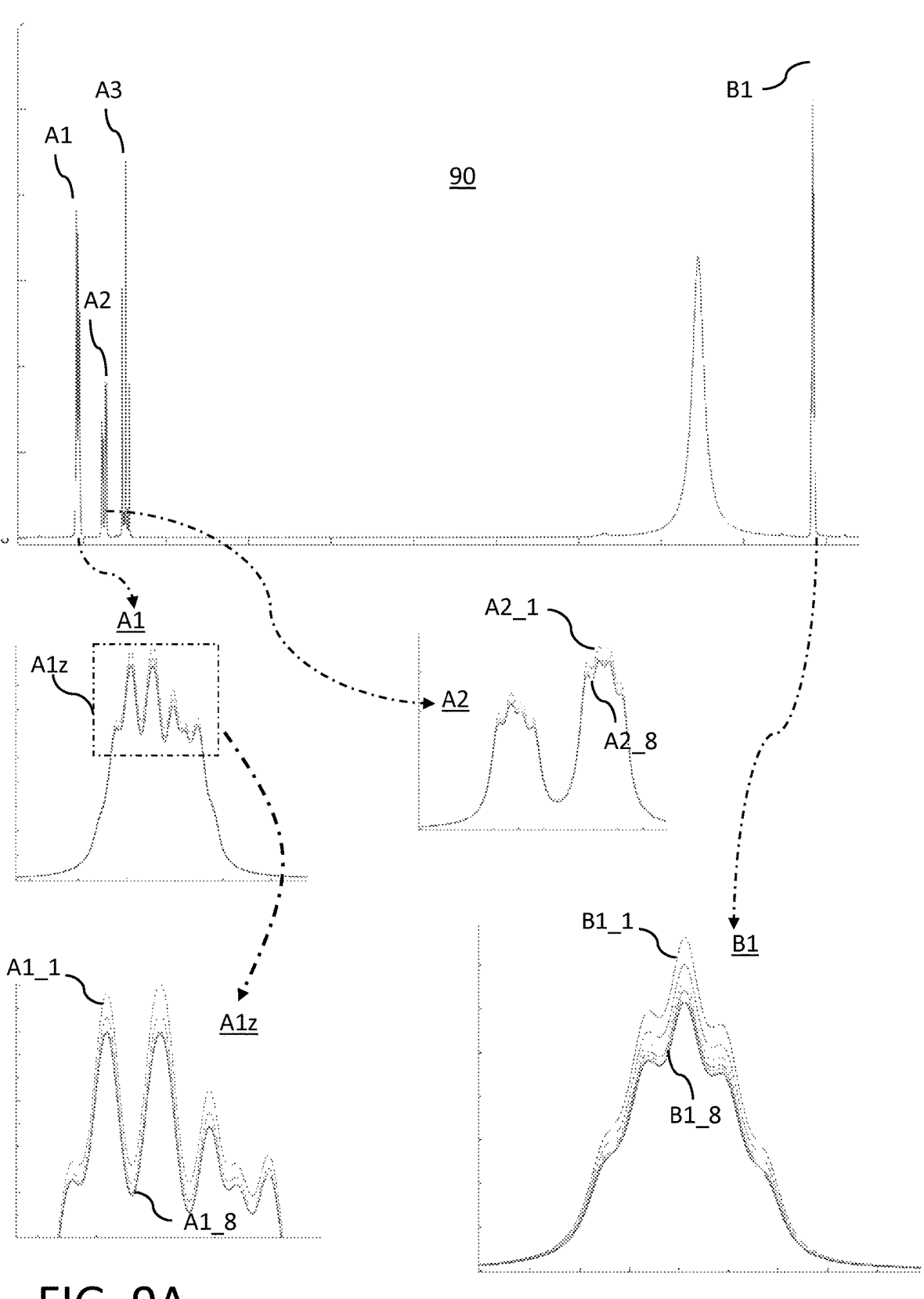

FIGS. 9A to 9I illustrate a comparison of results for ROI integrals between different setups for scan batches applied to the same sample. FIG. 9A shows an NMR spectrum 90 obtained from the sample. The spectrum 90 includes two ROIs A*, B* for two different molecules contained in the sample. In the example, the molecule associated with ROI A* is a known aromatic compound which shows three

TABLE 1 comparison of NMR measurements with and without short delay scans

| Delay | Number of Scans | Time | Ratio | Deviation | Remark |
|---|---|---|---|---|---|
| 60 s | 32 | 33 min 18 s | 1.6421 | — | Standard Acquisition |
| 30 s | 32 | 17 min 30 s | 1.6548 | 0.8% | Shorter Delay → less accurate |
| 2 s | 32 | 2 min 25 s | 1.5418 | 6% | Standard Acquisition Schema + correction → inaccurate |
| 4 × 60 s + 5 × 7 × 2 s) | 40 | 6 min 30 s | 1.6493 | 0.4% | Advances Acquistion Schema → Accurate + Short | multiplet peaks A1, A2 and A3 in the NMR spectrum. The molecule associated with ROI B* corresponds to dimethyl sulfoxide (DMSO) and causes a peak B1 in the NMR spectrum. In the experiment, the integral associated with A3 has shown to be unaffected by short delay intervals in the sense that the nuclei relaxation causing A3 is so fast that even after a short delay scan A3 shows near-full relaxation. However, there is a significant impact of a series of short delay scans on the respective peak integrals of A1, A2 and B1 in the form of an exponential decay over corresponding scan time points. As shown in the enlarged graph A1, and the even more enlarged zoom area A1z, eight aggregated spectra A1_1 to A1_8 are obtained for peak A1 with 32 NMR scans in four scan batches using a long delay scan followed by seven short delay scans. The aggregated spectra A1_1 to A1_8 show significant deviations. The same is true for the aggregated spectra A2_1 to A2_8 of peak A2 and the aggregated spectra B1_1 to B1_8 of peak B1.

FIG. 9B shows a result which has been obtained from said sample by 32 NMR scans including only long delay scans with long delay intervals of 60 s. The total measurement time for the 32 long delay scans was 33 min 22 s. Table 91-1 shows the ratios between the integrals associated with the four peaks in the ROIs A* and B*. It is to be noted that the peaks of A1 and A2 include multiple relatively broad sub-peaks whereas the peak A3 includes a plurality of very narrow sub-peaks. For this reason, the integral of A3 is about the same size as the integral of A2 whereas the integral of A1 is about twice as big as the integrals of A2 and A3. In the example, the theoretical integral ratio of the known aromatic compound is A1:A2:A3=2:1:1. This is confirmed by the long delay scan measurement summarized in table 91-1 where the integral ratio of A1 to A2 is 2.001 and A1 to A3 is 2.014. The integral ratio of A1 to B1 is 0.832. The ratio of A2 to A3 with 1.0057 is close to the theoretical ratio of 1. The ratio of A1 to B1 is derived as 0.832 from the measurements. Table 91-2 show the respective relative errors for the derived integral ratios. With the "long delay scan only" scans, all relative errors are below 1%.

FIG. 9C shows a result which has been obtained from said sample by 32 NMR scans including only short delay scans with short delay intervals of 2 s. The total measurement time for the 32 short delay scans was 2 min 30 s. The deviations for the A1:A2:A3 integral ratios from the theoretical ratios in table 92-1 are much more significant than in the long delay scan setup of FIG. 9B. However, the deviations between ratios of A* to B1 are really significant in the "short delay scan only" setup. When looking at table 92-2, the respective relative errors are in the order of 12% to 18%. Typically, the ratio between the integrals of two regions of interest is the relevant information to be derived from the spectra. The result obtained from the "short delay scan only" setup is therefore highly inaccurate and not useful for the analytic purpose to determine the concentration of DMSO from the NMR scan results.

Table 93 in FIG. 9D shows the deviation of the "short delay scan only" measurement of FIG. 9C in relation to the "long delay scan only" measurement in FIG. 9B. In particular for A3 there is substantially no deviation because A3 has such a short relaxation time that it is not affected by the short delay scans. However, with regard to A1 and A2, the "short delay scan only" integrals only arrive at 94% and 93% of the "long delay scan only" integrals, respectively. For the most interesting integral of B1, the highest deviation can be seen. The "short delay scan only" integral is only 83% of the "long delay scan only" integral. That is, a significant loss in the NMR signal intensity caused by measurements on not-yetrelaxed nuclei leads to low accuracy for these integrals determined with "short delay scan only" setup.

Figures 9E, 9F, 9G:
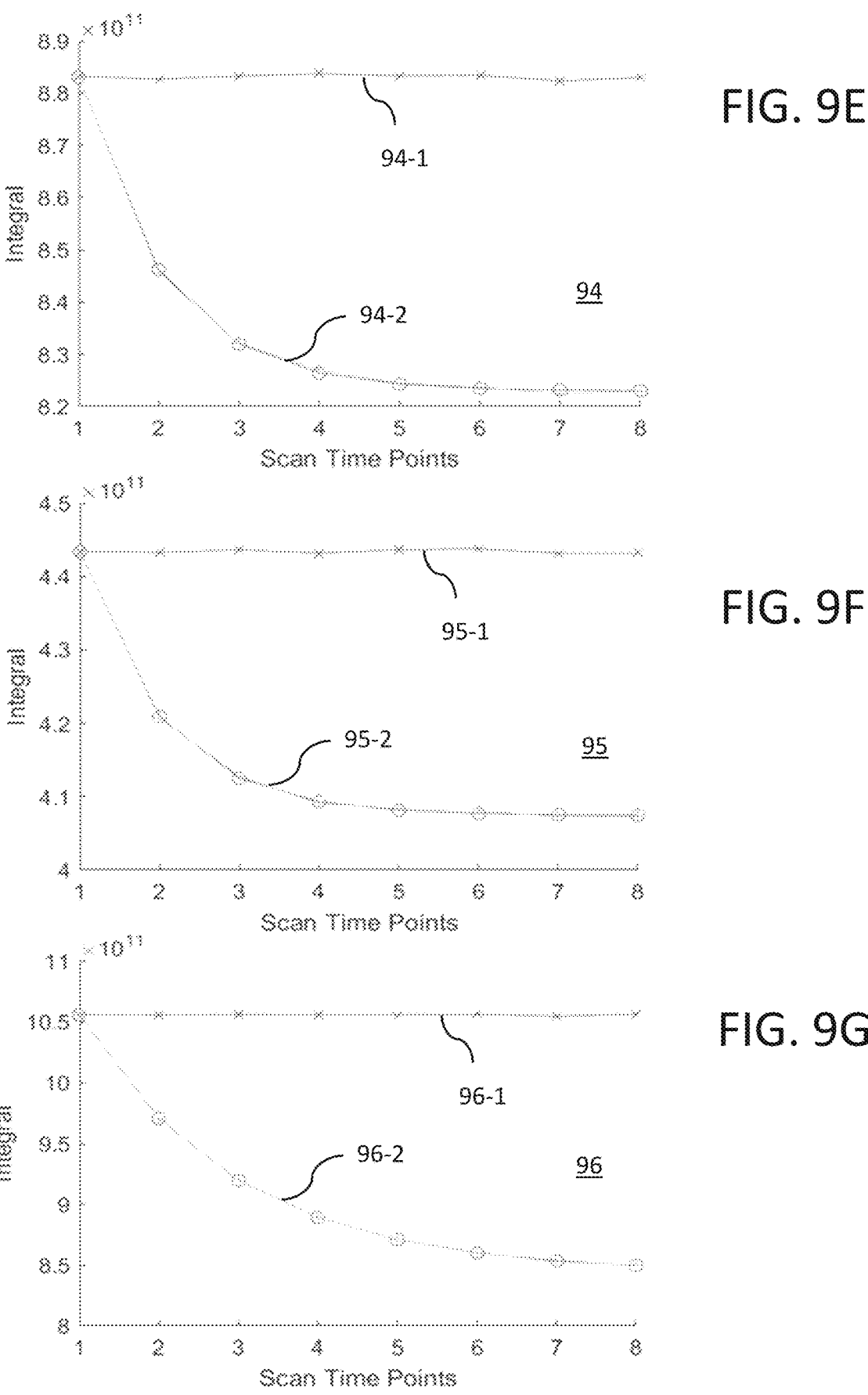

FIGS. 9E to 9G show the decay in the integrals of the aggregated spectra over the corresponding scan time points for A1, A2 and B1, respectively, as well as the corresponding corrected values. Graph 94 relates to A1 and the curve defined by the aggregate spectrum integrals (represented by circles) is fit with the exponential decay function resulting in curve 94-2. The corrected values are represented by x-icons and the resulting corrected curve 94—is almost constant over the corresponding scan time points. The same is true for A2 and B1 as can be seen in the respective graphs 95 and 96 with the exponential decay fit curves 95-2, 96-2 and the resulting corrected value curves 95-1 and 96-1.

FIGS. 9H, 9I illustrate results obtained from said sample by using scan batches in accordance with the herein disclosed approach. In FIG. 9H, the long delay interval before the long delay scan of a scan batch was 60 s. The short delay interval used for all the seven short delay scans in the scan batch was 1 s. The total measuring time for all four scan batches was 6 min. Table 97-1 shows the integral ratios between the peaks of the ROIs A* and B* as derived from the corrected spectra. The ratios for the known molecule associated with ROI A* are almost identical to the theoretical ratios with relative errors below 0.5% as shown in the relative error table 97-2. Also, the integral ratios derived from the corrected spectra with regard to B1 show very small relative errors in the order of only 1% and below.

FIG. 9I shows result obtained with a slightly different setup. The short delay interval used for all the seven short delay scans was 2 s to verify if an extended short delay interval leads to even higher accuracy. The total measuring time for all four scan batches in this setup was 7 min 20 s. The results for the integral ratios derived from the corrected spectra in table 98-1 show an accuracy which is almost equal to the accuracy of the results obtained with the shorter short delay intervals of 1 s in FIG. 9H. The relative errors in table 98-2 are again in the order of 1%. It had been recognized after the evaluation that the differences in the relative errors between the ratios A2/B1 (0.42) and A3/B1 (0.42) result from the differences of the ratios in not shown digits of the ratios. For visualization in table 98-1, the rations were rounded to two decimal places.

The herein disclosed approach achieves comparable high accuracy results for the corrected integrals even with very short "short delay intervals", thus leading to a substantial decrease of the total measuring time for NMR scans of samples with low concentrated substances.

Figure 10:
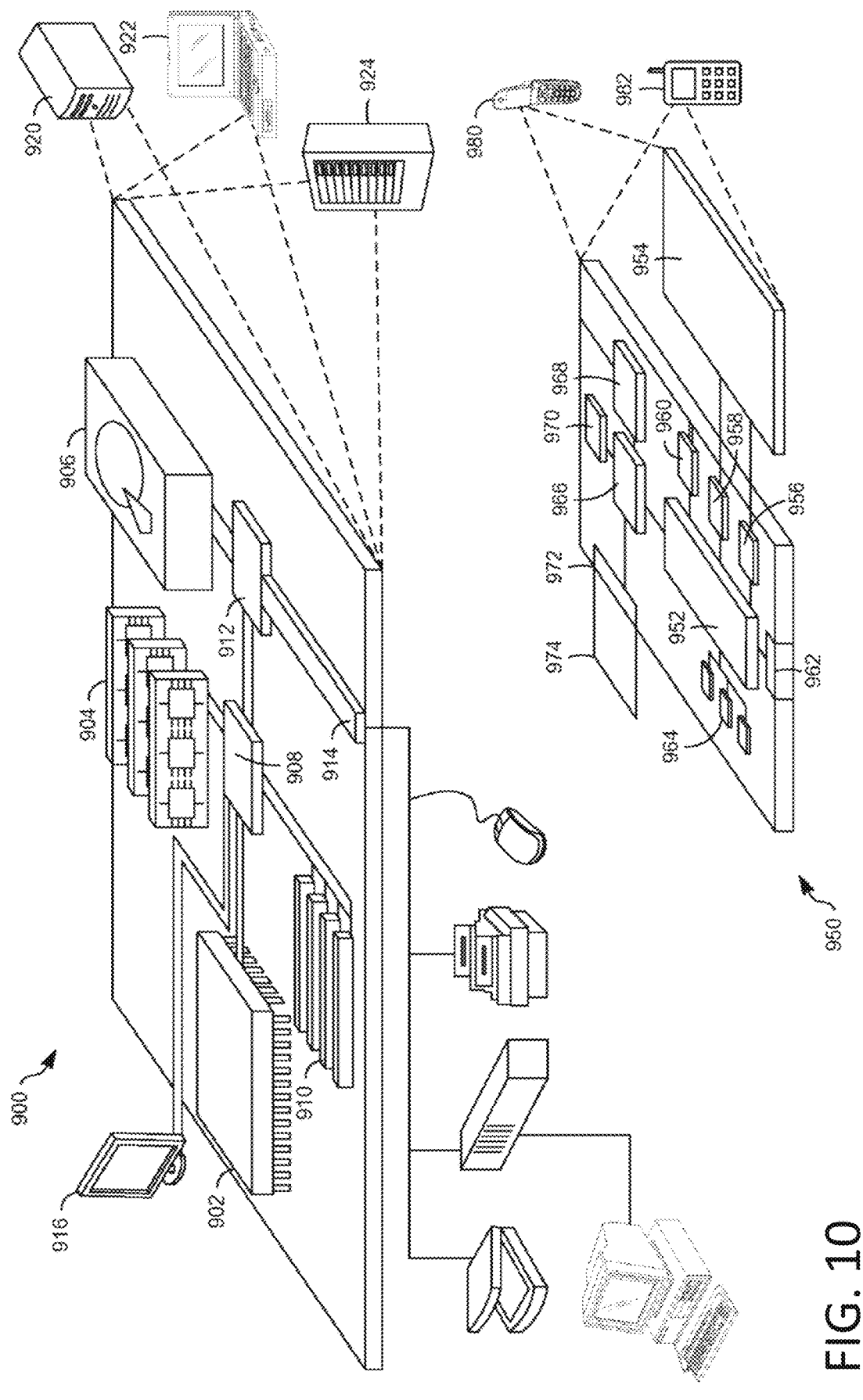
FIG. 10 is a diagram that shows an example of a generic computer device and a generic mobile computer device which may be used with the techniques described herein.

FIG. 10 is a diagram that shows an example of a generic computer device 900 and a generic mobile computer device 950, which may be used with the techniques described here. In some embodiments, computing device 900 may relate to system 100 (cf. FIG. 1). Computing device 950 is intended to represent various forms of mobile devices, such as personal digital assistants, cellular telephones, smart phones, and other similar computing devices. In the context of this disclosure the computing device 950 may provide I/O means for a user to interact with the computing device 900 (e.g., for displaying the provided preview images to a user). The components shown here, their connections and relationships, and their functions, are meant to be exemplary only, and are not meant to limit implementations described and/or claimed in this document.

Computing device 900 includes a processor 902, memory 904, a storage device 906, a high-speed interface 908 connecting to memory 904 and high-speed expansion ports 910, and a low-speed interface 912 connecting to low-speed bus 914 and storage device 906. Each of the components 902, 904, 906, 908, 910, and 912, are interconnected using various busses, and may be mounted on a common motherboard or in other manners as appropriate. The processor 902 can process instructions for execution within the computing device 900, including instructions stored in the memory 904 or on the storage device 906 to display graphical information for a GUI on an external input/output device, such as display 916 coupled to high-speed interface 908. In other implementations, multiple processors and/or multiple buses may be used, as appropriate, along with multiple memories and types of memory. Also, multiple computing devices 900 may be connected, with each device providing portions of the necessary operations (e.g., as a server bank, a group of blade servers, or a multi-processor system).

The memory 904 stores information within the computing device 900. In one implementation, the memory 904 is a volatile memory unit or units. In another implementation, the memory 904 is a non-volatile memory unit or units. The memory 904 may also be another form of computer-readable medium, such as a magnetic or optical disk.

The storage device 906 is capable of providing mass storage for the computing device 900. In one implementation, the storage device 906 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 904, the storage device 906, or memory on processor 902.

The high-speed controller 908 manages bandwidth-intensive operations for the computing device 900, while the low-speed controller 912 manages lower bandwidth-intensive operations. Such allocation of functions is exemplary only. In one implementation, the high-speed controller 908 is coupled to memory 904, display 916 (e.g., through a graphics processor or accelerator), and to high-speed expansion ports 910, which may accept various expansion cards (not shown). In the implementation, low-speed controller 912 is coupled to storage device 906 and low-speed expansion port 914. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 900 may be implemented in a number of different forms, as shown in the figure. For example, it may be implemented as a standard server 920, or multiple times in a group of such servers. It may also be implemented as part of a rack server system 924. In addition, it may be implemented in a personal computer such as a laptop computer 922. Alternatively, components from computing device 900 may be combined with other components in a mobile device (not shown), such as device 950. Each of such devices may contain one or more of computing device 900, 950, and an entire system may be made up of multiple computing devices 900, 950 communicating with each other.

Computing device 950 includes a processor 952, memory 964, an input/output device such as a display 954, a communication interface 966, and a transceiver 968, among other components. The device 950 may also be provided with a storage device, such as a microdrive or other device, to provide additional storage. Each of the components 950, 952, 964, 954, 966, and 968, are interconnected using various buses, and several of the components may be mounted on a common motherboard or in other manners as appropriate.

The processor 952 can execute instructions within the computing device 950, including instructions stored in the memory 964. The processor may be implemented as a chipset of chips that include separate and multiple analog and digital processors. The processor may provide, for example, for coordination of the other components of the device 950, such as control of user interfaces, applications run by device 950, and wireless communication by device 950.

Processor 952 may communicate with a user through control interface 958 and display interface 956 coupled to a display 954. The display 954 may be, for example, a TFT LCD (Thin-Film-Transistor Liquid Crystal Display) or an OLED (Organic Light Emitting Diode) display, or other appropriate display technology. The display interface 956 may comprise appropriate circuitry for driving the display 954 to present graphical and other information to a user. The control interface 958 may receive commands from a user and convert them for submission to the processor 952. In addition, an external interface 962 may be provide in communication with processor 952, so as to enable near area communication of device 950 with other devices. External interface 962 may provide, for example, for wired communication in some implementations, or for wireless communication in other implementations, and multiple interfaces may also be used.

The memory 964 stores information within the computing device 950. The memory 964 can be implemented as one or more of a computer-readable medium or media, a volatile memory unit or units, or a non-volatile memory unit or units. Expansion memory 984 may also be provided and connected to device 950 through expansion interface 982, which may include, for example, a SIMM (Single In Line Memory Module) card interface. Such expansion memory 984 may provide extra storage space for device 950, or may also store applications or other information for device 950. Specifically, expansion memory 984 may include instructions to carry out or supplement the processes described above, and may include secure information also. Thus, for example, expansion memory 984 may act as a security module for device 950, and may be programmed with instructions that permit secure use of device 950. In addition, secure applications may be provided via the SIMM cards, along with additional information, such as placing the identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 964, expansion memory 984, or memory on processor 952, that may be received, for example, over transceiver 968 or external interface 962.

Device 950 may communicate wirelessly through communication interface 966, which may include digital signal processing circuitry where necessary. Communication interface 966 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 968. In addition, short-range communication may occur, such as using a Bluetooth, WiFi, or other such transceiver (not shown). In addition, GPS (Global Positioning System) receiver module 980 may provide additional navigation- and location-related wireless data to device 950, which may be used as appropriate by applications running on device 950.

Device 950 may also communicate audibly using audio codec 960, which may receive spoken information from a user and convert it to usable digital information. Audio codec 960 may likewise generate audible sound for a user, such as through a speaker, e.g., in a handset of device 950. Such sound may include sound from voice telephone calls, may include recorded sound (e.g., voice messages, music files, etc.) and may also include sound generated by applications operating on device 950.

The computing device 950 may be implemented in a number of different forms, as shown in the figure. For example, it may be implemented as a cellular telephone 980. It may also be implemented as part of a smart phone 982, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing device that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing device can include clients and servers. A client and server are generally remote from each other and typically interact through a communication network. The relationship of client and server arises by virtue of computer programs running on the respective computers and having a client-server relationship to each other.

The invention claimed is:

1. A computer-implemented method for fast quantitative NMR data acquisition for a plurality of NMR scans performed on a sample, the method comprising:
  obtaining a region of interest as an integration region of NMR spectra, the region of interest corresponding to respective nuclei of the sample;
  initiating a plurality of scan batches on the sample wherein each batch comprises a long delay scan performed after a long delay interval ensuring near-full relaxation of said nuclei, followed by a set of short delay scans, each short delay scan performed after a short delay interval shorter than the long delay interval, such that a total number of NMR scans in the plurality of scan batches is greater or equal to a minimal required number of NMR scans for the sample, wherein each scan is associated with a corresponding scan time point in relation to a long delay scan time point of a respective scan batch;
  determining, for each corresponding scan time point, aggregated NMR spectrum portions in the region of interest, via integration over said region of interest, wherein the aggregated NMR spectrum portions at the corresponding scan time points show a decay over time;
  fitting the decay with an exponential decay function to obtain a fitted function;
  computing an averaged integral loss for each scan time point by applying the fitted function to each scan time point, and determining from the averaged integral loss a correction factor for each scan time point such that a corresponding averaged integral loss is compensated;
  multiplying, for each NMR spectrum of the plurality of scan batches, an integral associated with a respective region of interest with a corresponding correction factor; and
  summing up the integrals associated with the corrected NMR spectra in all batches to obtain a representation of a NMR signal intensity in the region of interest for the sample.

2. The method of claim 1, wherein the long delay interval (LD) for near-full relaxation of the sample is selected from a range of 30 s to 120 s to allow a relaxation of the sample above 99%, and wherein one or more short delay intervals (SD) are selected from the range of 0 s to 2 s.

3. The method of claim 1, wherein obtaining a long delay interval comprises determining the long delay interval via an experiment, and wherein one or more short delay intervals are selected from a range of 0 s to 2 s.

4. The method of claim 1, wherein the short delay intervals have a single short delay value used for all short delay scans of each scan batch.

5. The method of claim 1, wherein at least two corresponding short delay intervals of each batch use different short delay values.

6. The method of claim 1, wherein the set of short delay scans in a scan batch comprises 3 to 9 short delay scans.

7. The method of claim 1, further comprising:

providing an estimated NMR signal intensity in the region of interest for said sample after each scan batch by summing up the integrals of all corrected individual NMR spectra in already processed scan batches.

8. The method of claim 1, wherein excitation pulses applied to the sample for obtaining an individual NMR spectra have a flip angle smaller than or equal to 90° and greater than 0°.

9. The method of claim 8, wherein the flip angle is in a range from 30° to 45°.

10. The method of claim 1, wherein the correction factor is calculated for and applied to all points within the region of interest of each individual NMR spectrum of the respective batch.

11. The method of claim 1, wherein the correction factor is calculated for and applied to all points of each individual NMR spectrum of the respective batch, and wherein all corrected individual NMR spectra are summed up into a single aggregated NMR spectrum.

12. The method of claim 1, further comprising:

after the delay interval of a current individual NMR scan and before a subsequent excitation pulse is applied to the sample, initiating an application of a trim pulse to the sample for removing residual transverse magnetization.

13. The method of claim 1, wherein determining comprises:

applying a Fourier transformation to each individual NMR scan to obtain a corresponding individual NMR spectrum for each scan time point, and aggregating corresponding portions of individual NMR spectra associated with corresponding scan time points in the plurality of scan batches into the aggregated NMR spectrum portions in the region of interest, or aggregating the individual NMR scans of corresponding scan time points into respective aggregated NMR scans, and applying a Fourier transformation to the aggregated NMR scans to obtain the aggregated NMR spectrum portions for the corresponding scan time points in the region of interest.

14. A computer program product for fast quantitative NMR data acquisition for a plurality of NMR scans performed on a sample, the computer program product being tangibly embodied on a non-transitory computer-readable storage medium and comprising instructions that, when executed by at least one computing device, are configured to cause the at least one computing device to:

obtain a region of interest as an integration region of NMR spectra, the region of interest corresponding to respective nuclei of the sample;

initiate a plurality of scan batches on the sample wherein each batch comprises a long delay scan performed after a long delay interval ensuring near-full relaxation of said nuclei, followed by a set of short delay scans, each short delay scan performed after a short delay interval shorter than the long delay interval, such that a total number of NMR scans in the plurality of scan batches is greater or equal to a minimal required number of NMR scans for the sample, wherein each scan is associated with a corresponding scan time point in relation to a long delay scan time point of a respective scan batch;

determine, for each corresponding scan time point, aggregated NMR spectrum portions in the region of interest, via integration over said region of interest, wherein the aggregated NMR spectrum portions at the corresponding scan time points show a decay over time;

fit the decay with an exponential decay function to obtain a fitted function;

compute an averaged integral loss for each scan time point by applying the fitted function to each scan time point, and determining from the averaged integral loss a correction factor for each scan time point such that a corresponding averaged integral loss is compensated;

multiply, for each NMR spectrum of the plurality of scan batches, an integral associated with a respective region of interest with a corresponding correction factor; and sum up the integrals associated with the corrected NMR spectra in all batches to obtain a representation of a NMR signal intensity in the region of interest for the sample.

15. The computer program product of claim 14, wherein the instructions, when executed by the at least one computing device, are further configured to cause the at least one computing device to:

provide an estimated NMR signal intensity in the region of interest for said sample after each scan batch by summing up the integrals of all corrected individual NMR spectra in already processed scan batches.

16. The computer program product of claim 14, wherein the instructions, when executed by the at least one computing device, are further configured to cause the at least one computing device to:

after the delay interval of a current individual NMR scan and before a subsequent excitation pulse is applied to the sample, initiate an application of a trim pulse to the sample for removing residual transverse magnetization.

17. The computer program product of claim 14, wherein the instructions, when executed by the at least one computing device, are further configured to cause the at least one computing device to:

apply a Fourier transformation to each individual NMR scan to obtain a corresponding individual NMR spectrum for each scan time point, and aggregating corresponding portions of individual NMR spectra associated with corresponding scan time points in the plurality of scan batches into the aggregated NMR spectrum portions in the region of interest, or aggregate the individual NMR scans of corresponding scan time points into respective aggregated NMR scans, and applying a Fourier transformation to the aggregated NMR scans to obtain the aggregated NMR spectrum portions for the corresponding scan time points in the region of interest.

18. A computer system for fast quantitative NMR data acquisition for a plurality of NMR scans performed on a sample, the system comprising a memory storing computer-readable instructions implementing a plurality of functional modules, and one or more processors of the computing device for executing the computer-readable instructions to instantiate said functional modules for:

obtaining a region of interest as an integration region of NMR spectra, the region of interest corresponding to respective nuclei of the sample;

initiating a plurality of scan batches on the sample wherein each batch comprises a long delay scan performed after a long delay interval ensuring near-full relaxation of said nuclei, followed by a set of short delay scans, each short delay scan performed after a short delay interval shorter than the long delay interval, such that a total number of NMR scans in the plurality of scan batches is greater or equal to a minimal required number of NMR scans for the sample, wherein each scan is associated with a corresponding scan time point in relation to a long delay scan time point of a respective scan batch;

determining, for each corresponding scan time point, aggregated NMR spectrum portions in the region of interest, via integration over said region of interest, wherein the aggregated NMR spectrum portions at the corresponding scan time points show a decay over time;

fitting the decay with an exponential decay function to obtain a fitted function;

computing an averaged integral loss for each scan time point by applying the fitted function to each scan time point, and determining from the averaged integral loss a correction factor for each scan time point such that a corresponding averaged integral loss is compensated;

multiplying, for each NMR spectrum of the plurality of scan batches, an integral associated with a respective region of interest with a corresponding correction factor; and summing up the integrals associated with the corrected NMR spectra in all batches to obtain a representation of a NMR signal intensity in the region of interest for the sample.

19. The system of claim 18, wherein the long delay interval (LD) for near-full relaxation of the sample is selected from a range of 30 s to 120 s to allow a relaxation of the sample above 99%, and wherein one or more short delay intervals (SD) are selected from the range of 0 s to 2 s.

20. The system of claim 18, wherein obtaining a long delay interval comprises determining the long delay interval via an experiment, and wherein one or more short delay intervals are selected from a range of 0 s to 2 s.

* * * * *